US008649504B2

(12) United States Patent
Yu

(10) Patent No.: US 8,649,504 B2
(45) Date of Patent: Feb. 11, 2014

(54) METHOD AND CIRCUITRY FOR MATCHING IMPEDANCE

(75) Inventor: Zhuwei Yu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/641,758

(22) PCT Filed: Oct. 20, 2011

(86) PCT No.: PCT/CN2011/081048

§ 371 (c)(1), (2), (4) Date: Oct. 17, 2012

(87) PCT Pub. No.: WO2012/065490

PCT Pub. Date: May 24, 2012

(65) Prior Publication Data

US 2013/0223620 A1 Aug. 29, 2013

(30) Foreign Application Priority Data

Nov. 15, 2010 (CN) .......................... 2010 1 0543764

(51) Int. Cl.
*H03M 1/00* (2006.01)
*H03K 17/16* (2006.01)

(52) U.S. Cl.
USPC ............................................. 379/394; 326/30

(58) Field of Classification Search
USPC ............................................ 379/404, 413.03
See application file for complete search history.

(56) References Cited

U.S. PATENT DOCUMENTS

| | | | | |
|---|---|---|---|---|
| 5,953,409 | A | 9/1999 | Carlsen | |
| 6,331,785 | B1 * | 12/2001 | Swanson et al. | 326/30 |
| 2006/0165110 | A1 * | 7/2006 | Magendanz et al. | 370/419 |
| 2006/0170450 | A1 * | 8/2006 | Pelley | 326/30 |
| 2007/0153132 | A1 * | 7/2007 | Jong | 348/705 |
| 2010/0302106 | A1 * | 12/2010 | Knudsen et al. | 343/702 |
| 2012/0038523 | A1 * | 2/2012 | Song | 343/703 |

FOREIGN PATENT DOCUMENTS

| | | | |
|---|---|---|---|
| CN | 101146144 | A | 3/2008 |
| CN | 102006028 | A | 4/2011 |

OTHER PUBLICATIONS

International Search Report for PCT/CN2011/081048 dated Dec. 20, 2011.

* cited by examiner

*Primary Examiner* — Fan Tsang
*Assistant Examiner* — Jeffrey Lytle
(74) *Attorney, Agent, or Firm* — Ling Wu; Stephen Yang; Ling and Yang Intellectual Property

(57) ABSTRACT

A method and circuit for matching impedance, wherein, a peripheral impedance detection module detects the user telephone impedance and outputs information about the user telephone impedance; an analog switch handover module provides an impedance matching path between the user telephone impedance and an impedance matching module according to information about the user telephone impedance output by the peripheral impedance detection module; the impedance matching module provides a corresponding impedance to match the user telephone impedance through the impedance matching path provided by the analog switch handover module. The above-mentioned technical scheme realizes the impedance matching when communicating between a wireless access box and telephones with different impedance modes. The matching process is automatic and flexible and does not need the manual configuration, and the realization technology is simple and reliable, and the cost is low.

15 Claims, 2 Drawing Sheets

METHOD AND CIRCUITRY FOR MATCHING IMPEDANCE

TECHNICAL FIELD

The present invention relates to the analog interface technology field of the communication device, and in particular, to a method and circuit for matching impedance.

BACKGROUND OF THE RELATED ART

The wireless access box is a kind of wireless access terminal, connected with the telephone through the interface (such as the RJ11 interface) offered by the user interface circuit, can realize the wireless access service of each operator in the world by adopting various systems, and realizes the voice communication within the cover range of the wireless network.

On the current router or the Ethernet switchboard, there is a transmission interface through which it can be realized that routers or switchboards are interconnected and used at the same time. In these interfaces of the current devices, it generally adopts the E1 interface of the European system and the T1 interface of North American, etc., and these interfaces have different impedance types. Wherein, the E1 interface usually supports the peripheral with 120 ohms and 75 ohms impedance, and the T1 interface supports the peripheral of 100 ohms. While the telephones used by the users of each country are different, their internal impedances are divided into these 3 different kinds too, and the impedance matching of the wireless access box and the telephone becomes a problem.

At present, there is a kind of solution directed at the three kinds of impedance standards of the E1 and T1 interface, which changes the parameters of the interface circuit board of the wireless access box, and selects different impedances to match separately. Each kind of interface mode corresponds to a kind of interface circuit board separately, and it needs to design three kinds of interface circuit boards with different impedances to be able to meet the delivery demand of various areas. The kind of solution has at least two shortcomings: increasing the interface circuit board additionally, and increasing the design cost; various types of the interface circuit boards, and inflexible product configuration management.

Another solution is configuration by hand, that is, designing a toggle switch on the wireless access box mother board, and selecting different impedance modes by turning the toggle switch. This solution also has several shortcomings, which are as follows:

(1), in order to realize matching of the three kinds of impedance modes, it needs to design at least a 4-way toggle switch, which not only causes that the appearance of the wireless access box increases the position of the toggle switch, but also the toggle switch itself costs high, the area of the mother board PCB of the wireless access box is increased additionally, and the cost is increased doubly;

(2), the practical operation is complex, and additional instruction is needed for the usage by the user, otherwise the artificial fault operation appears easily;

(3), it contacts by using the metal spring within the toggle switch, and it is easy to cause the metal spring to wear out and then cause the poor contact after the numerous operations for a long time, and the reliability is not good.

SUMMARY OF THE INVENTION

The technical problem that the present invention requires to solve is to provide a method and circuit for matching impedance, to realize the automatic and flexible matching of the impedance.

A circuit for matching impedance comprises a peripheral impedance detection module, an analog switch handover module and an impedance matching module connected successively, wherein:

the peripheral impedance detection module is configured to detect a user telephone impedance and output information about the user telephone impedance;

the analog switch handover module is configured to provide an impedance matching path between the user telephone impedance and an impedance matching module according to the information about the user telephone impedance; and the impedance matching module is configured to provide a corresponding impedance to match the user telephone impedance through the impedance matching path provided by the analog switch handover module. Wherein, the peripheral impedance detection module comprises an analog-to-digital conversion (ADC) detection module, wherein:

the ADC detection module is configured to: according to a resistance value of the user telephone impedance, output the user telephone impedance information in a high level or low level format.

Wherein, the ADC detection module comprises: a first resistance (R0), a second resistance (R1), a third resistance (R2), a fourth resistance (R3), a first voltage comparator (N1) and a second voltage comparator (N2), wherein:

one end of the first resistance (R0) connects a system power (Vcc), another end connects a user telephone impedance (Rx) and negative input ends of the first voltage comparator (N1) and the second voltage comparator (N2); one end of the second resistance (R1) is earthed, another end connects a positive input end of the first voltage comparator (N1) and the third resistance (R2); one end of the third resistance (R2) connects the positive input end of the first voltage comparator (N1) and the second resistance (R1), another end connects a positive input end of the second voltage comparator (N2) and the fourth resistance (R3); one end of the fourth resistance (R3) connects the system power (Vcc), another end connects the positive input end of the second voltage comparator (N2) and the third resistance (R2); the second resistance (R1), the third resistance (R2), and the fourth resistance (R3) are divider resistances, providing reference voltage of the first voltage comparator (N1) and the second voltage comparator (N2); output ends of the first voltage comparator (N1) and the second voltage comparator (N2) connect the analog switch handover module, the first voltage comparator (N1) and the second voltage comparator (N2) output the high level or low level according to a resistance value of the user telephone impedances (Rx).

Wherein, the impedance matching module comprises a fifth resistance (Ry) and a sixth resistance (Rz), when both the first voltage comparator (N1) and the second voltage comparator (N2) output the high level, the analog switch handover module sets the user telephone impedance (Rx) to connect with the sixth resistance (Rz), to obtain a total input impedance which is the resistance value of the user telephone impedance (Rx) added by a resistance value of the sixth resistance (Rz); when the first voltage comparator (N1) outputs the low level and the second voltage comparator (N2) outputs the high level, the analog switch handover module sets the user telephone impedance (Rx) to connect with the fifth resistance (Ry), to obtain the total input impedance which is the resistance value of the user telephone impedance (Rx) added by the resistance value of the fifth resistance (Ry); when both the first voltage comparator (N1) and the second voltage comparator (N2) output the low level, the analog switch handover module sets the user telephone impedance (Rx) to connect with the fifth resistance (Ry) and the sixth resistance (Rz), to obtain the total input impedance which is the resistance value of the user telephone impedance (Rx) added by a parallel resistance value of the fifth resistance (Ry) and the sixth resistance (Rz).

Wherein, the analog switch handover module is a analog switch (S), a first IN end (IN1) of the analog switch (S) connects an output end of the first voltage comparator (N1), a second IN end (IN2) of the analog switch (S) connects an output end of the second voltage comparator (N2), a first NO end (NO1) and a first NC end (NC1) of the analog switch (S) connect one unearthed end of the user telephone impedance (Rx), a second NO end (NO2) connects one end of the fifth resistance (Ry), a second NC end (NC2) connects one end of the sixth resistance (Rz); when both the first voltage comparator (N1) and the second voltage comparator (N2) output the high level, the first NC end (NC1) and the second NC end (NC2) of the analog switch (S) connect each other, to make the user telephone impedance (Rx) connect the sixth resistance (Rz); when the first voltage comparator (N1) outputs the low level and the second voltage comparator (N2) outputs the high level, the first NC end (NC1) and the second NO end (NO2) of the analog switch (S) connect each other, to make the user telephone impedance (Rx) connect the fifth resistance (Ry); when both the voltage comparator (N1) and the second voltage comparator (N2) output the low level, four ports, the first NC end (NC1), the second NC end (NC2), the first NO end (NO1) and the second NO end (NO2) of the analog switch (S) connect with each other, to make the user telephone impedance (Rx) connect both the fifth resistance (Ry) and the sixth resistance (Rz).

Wherein, the analog switch handover module comprises a first field effect tube (VT1) and a second field effect tube (VT2), wherein:

a grid of the first field effect tube (VT1) connects the output end of the first voltage comparator (N1), a grid of the second field effect tube (VT2) connects the output end of the second voltage comparator (N2), drains of the first field effect tube (VT1) and the second field effect tube (VT2) connect one unearthed end of the user telephone impedance (Rx), a source of the first field effect tube (VT1) connects one end of the fifth resistance (Ry), a source of the second field effect tube (VT2) connects one end of the sixth resistance (Rz); when both the first voltage comparator (N1) and the second voltage comparator (N2) output the high level, the first field effect tube (VT1) is in an on state, and the second field effect tube (VT2) is in an off state, to make the user telephone impedance (Rx) connect the sixth resistance (Rz); when the first voltage comparator (N1) outputs the low level and the second voltage comparator (N2) outputs the high level, the first field effect tube (VT1) is in the off state, and the second field effect tube (VT2) is in the on state, to make the user telephone impedance (Rx) connect the fifth resistance (Ry); when both the first voltage comparator (N1) and the second voltage comparator (N2) output the low level, both the first field effect tube (VT1) and the second field effect tube (VT2) are in the on state, to make the user telephone impedance (Rx) connect the fifth resistance (Ry) and the sixth resistance (Rz).

Wherein, the reference voltage provided by the second resistance (R1), the third resistance (R2) and the fourth resistance (R3) for the first voltage comparator (N1) is +1.8V, the reference voltage provided for the second voltage comparator (N2) is +3.3V, and the system power (Vcc) is +5V.

Wherein, a resistance value of the fifth resistance (Ry) is 50 ohms, a resistance value of the six resistance (Rz) is 75 ohms, and the total input impedance is 150 ohms.

A wireless access box comprises a circuit for matching impedance.

A method for matching impedance comprises:

a peripheral impedance detection module detecting a user telephone impedance and outputting information about a user telephone impedance;

an analog switch handover module providing an impedance matching path between the user telephone impedance and an impedance matching module according to the information about the user telephone impedance output by the peripheral impedance detection module;

the impedance matching module providing a corresponding impedance to match the user telephone impedance through the impedance matching path provided by the analog switch handover module.

Through the above-mentioned scheme of the present invention, it realizes the impedance matching when communicating between a wireless access box and telephones with different impedance modes. The matching process is automatic and flexible and does not need the manual configuration, and the realization technology is simple and reliable, and the cost is low.

PREFERRED EMBODIMENTS OF THE PRESENT INVENTION

The technical scheme of the present invention, in a situation without adding external interface matching circuit board and the toggle switch, realizes the automatic and flexible matching of the impedance for externally connected telephone interface of three kinds of different impedance modes.

Figure 1:
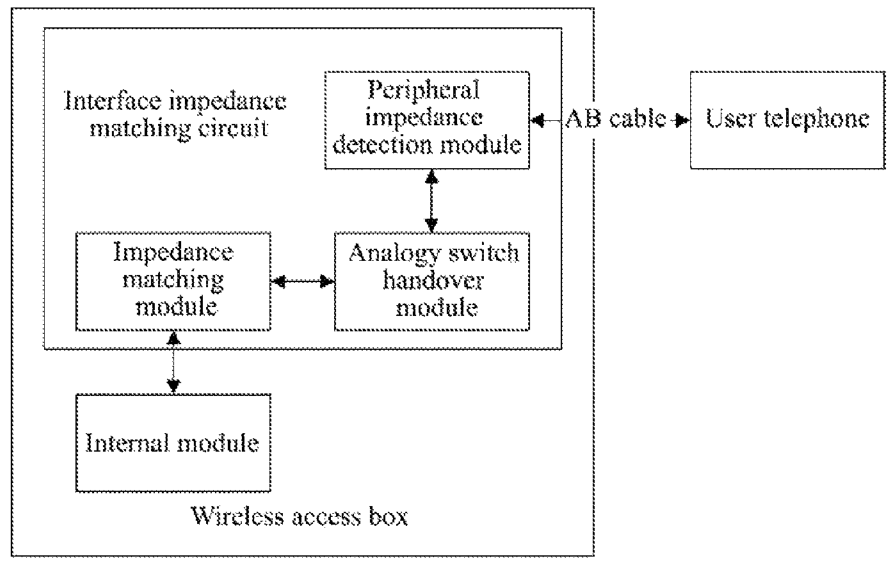
FIG. 1 is a diagram of impedance matching of the interface of a wireless access box according to an embodiment of the present invention.

As shown in FIG. 1, the user telephone connects the wireless access box through its communication interface (RJ11 interface) and the AB cable. The AB cable has two kinds of functions: first, realizing the communication between the user telephone and the wireless access box; second, detecting the impedance within the user telephone. The wireless access box includes an interface impedance matching circuit and an internal module therein, wherein, the interface impedance matching circuit includes a peripheral impedance detection module, an analog switch handover module and an impedance matching module connected successively; wherein, the peripheral impedance detection module is configured to detect a user telephone impedance and output impedance information of the user telephone; the analog switch handover module is configured to provide an impedance matching path between user telephone impedance and an impedance matching module according to the impedance information of the user telephone output by the peripheral impedance detection module; and the impedance matching module is configured to provide a corresponding impedance to match the user telephone impedance through the impedance matching path provided by the analog switch handover module. The internal module is used for realizing other functions of the wireless access box communication.

The final effect of the impedance matching is to make the impedance value from the output end of the user interface chip (SLIC) of the wireless access box to the user telephone end be fixed, and the impedance value must meet the impedance requirement within the user interface chip. Only if the internal and external impedance are matched, it could prevent the signal from the phenomenon of being distorted in the transmission process.

Wherein, the peripheral impedance detection module includes one analog-to-digital conversion (ADC) detection module, wherein: the ADC detection module is configured to: according to a resistance value of the user telephone impedance, output the user telephone impedance information in a high level or low level format.

The impedance matching module can include the impedance compensation group matched with three kinds of different user telephone impedances, used for, after the user telephones with three kinds of different impedances access the wireless access box, realizing same impedance in the internal module.

Figure 2:
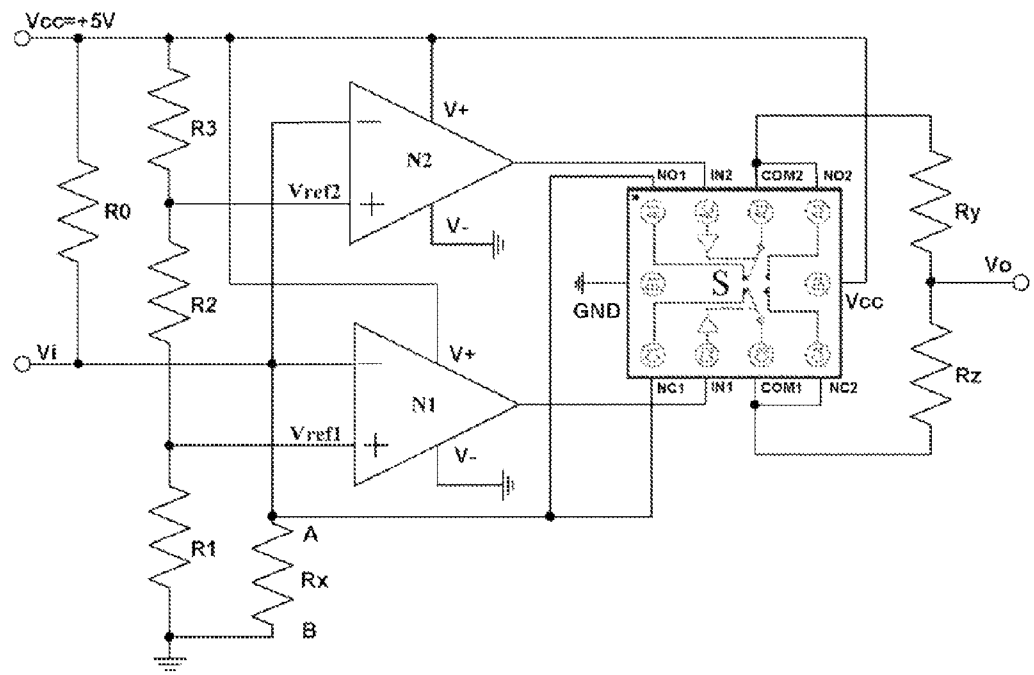
FIG. 2 is a circuit of a wireless access box interface for matching impedance according to application example one of the present invention.
Figure 3:
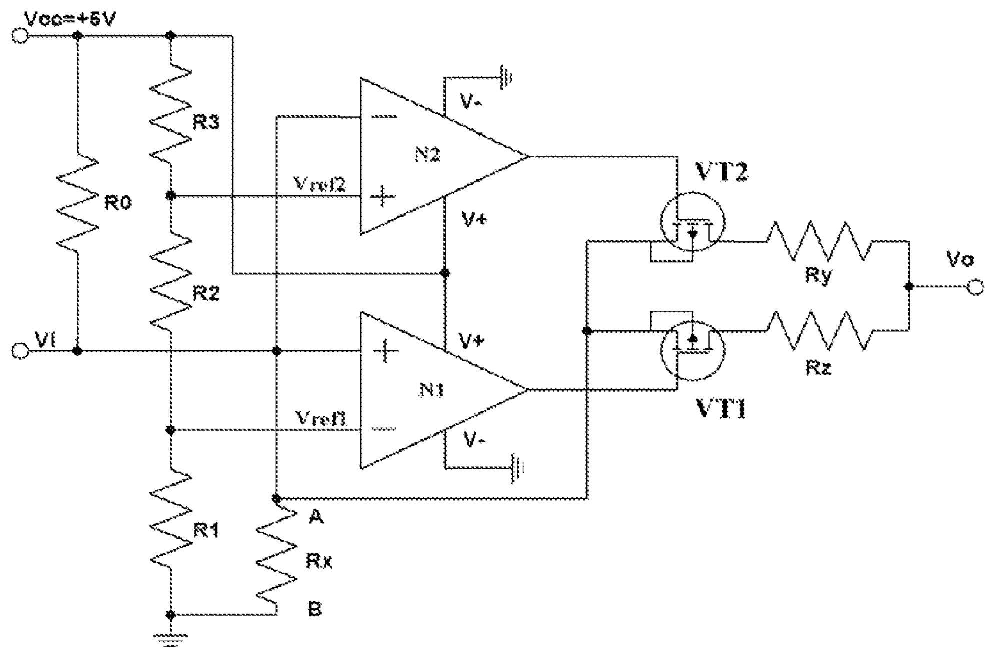
FIG. 3 is a circuit of a wireless access box interface for matching impedance according to application example two of the present invention.

FIG. 2 and FIG. 3 show two kinds of realization scheme of the interface impedance matching circuit of the wireless access box, wherein, the realization ways of the peripheral impedance detection module (including the ADC detection module) and the impedance matching module in two kinds of schemes are same, and the analog switch handover module is realized by adopting an analog switch in the scheme of FIG. 2, and realized by adopting two field effect tubes in the scheme of FIG. 3.

Application Example One

FIG. 2 is a circuit of a wireless access box interface for matching impedance according to application example one of the present invention, wherein:

the ADC detection module includes: a resistance (RO), a resistance (R1), a resistance (R2), a resistance (R3), a voltage comparator (N1) and a voltage comparator (N2); wherein, one end of the resistance (R0) connects a system power (Vcc), another end connects a user telephone impedance (Rx) and negative input ends of the voltage comparator (N1) and the voltage comparator (N2); one end of the resistance (R1) is earthed, another end connects a positive input end of the voltage comparator (N1) and the resistance (R2); one end of the resistance (R2) connects the positive input end of the voltage comparator (N1) and the resistance (R1), another end connects a positive input end of the voltage comparator (N2) and the resistance (R3); one end of the resistance (R3) connects the system power (Vcc), another end connects the positive input end of the voltage comparator (N2) and the resistance (R2); the resistance (R1), the resistance (R2), and the resistance (R3) are divider resistances, providing reference voltage Vref1, Vref2 of the voltage comparator (N1) and the voltage comparator (N2) respectively; output ends of the voltage comparator (N1) and the voltage comparator (N2) connect the analog switch handover module, according to a resistance value of the user telephone impedance Rx, the voltage comparator (N1) and the voltage comparator (N2) output the high level or low level.

The system power Vcc, of which the voltage is +5V, is used for supplying power for the whole impedance matching circuit, supplying power for the two voltage comparators N1 and N2, and the analog switch handover module respectively, and also provides the reference voltage Vref1, Vref2 for the two comparators N1 and N2 and the input voltage Vi through voltage division at the same time.

The two-stage reference voltage Vref1=1.8V and Vref2=3.3V, the reference voltage can also be changed by adjusting the resistance value of the three divider resistances R1, R2 and R3 according to the actual situation.

The input voltage Vi of the voltage comparators N1 and N2 is obtained after the voltage division of the system power Vcc according to the user telephone impedance Rx and the resistance R0, the input voltage Vi of the comparator changes dynamically with difference of the value of the user telephone impedance Rx. Because there are only three kinds of user telephone impedances, there are three kinds of values of the input voltage Vi of the comparator N1. And the voltage Vi can be adjusted to three different ranges according to the rational selection of the value of the resistance R0, which are three voltage ranges of 0-1.8V, 1.8V-3.3V and 3.3V-5V respectively. In this way, it can distinguish the user telephones with three kinds of resistant based on different input voltage Vi of the comparators.

The impedance matching module includes a resistance Ry and a resistance Rz; the analog switch handover module is an analog switch S, its IN end is a control end; and the normal open (NO) end is normal-open end; the normal close (NC) is a normal-closed end. The IN1 end of the analog switch S connects the output end of the voltage comparator N1, the IN2 end of the analog switch S connects the output end of the voltage comparator N2, the NO1 and the NC1 of the analog switch S connect one unearthed end of the user telephone impedance Rx, the NO2 connects one end of the resistance Ry, and the NC2 connects one end of the resistance Rz.

The same path of signal voltage is input into the two voltage comparators N1 and N2, but the value of the reference voltage Vref1 and Vref2 of the non-inverting input end of the two-stage circuit are different. The reference voltage of N1 Vref=1.8V, and the reference voltage of N2 Vref2=3.3V. According to the difference of the user telephone impedance Rx, the input voltage Vi of the comparator is different too, and there are the following three situations altogether:

(1), when the impedance of the user telephone Rx=75 ohms, the input voltage of the comparator 0V<Vi<1.8V, both the comparator N1 and N2 output the high level, and the states are “1”. The analog switch S is in a state that the NC1 and the NC2 ends are open (that is, the NC1 and the NC2 ends direct connect with each other), and the total input impedance is that R=Rx+Rz=75+75=150 ohms at this moment.

(2), when the impedance of the user telephone Rx=100 ohms, the input voltage of the comparator 1.8V<Vi<3.3V, the comparator N1 outputs the low level, and the state changes into “0”; and the comparator N2 still outputs the high level, and the state is still “1”. The analog switch S is in a state that the NC1 and the NC2 ends are open (that is, the NC1 and the NC2 ends direct connect with each other), and the total input impedance is that R=Rx+Ry=100+50=150 ohms.

(3), when the impedance of the user telephone Rx=120 ohms, the input voltage of the comparator 3.3V<Vi<5V, both the comparator N1 and N2 output the low level, and the states are “0”. The analog switch S is in a “all-on” state, that is, the four ports, NC1, NC2, NO1 and NO2, are all open (that is, the four ports of NC1, NC2, NO1 and NO2 connect with each other), and the total input impedance is that R=Rx+Ry//Rz=120+50×75/(50+75)=120+30=150 ohms at this moment. Wherein, Ry//Rz represents that Ry and Rz connect in parallel.

Application Example Two

FIG. 3 is a circuit of a wireless access box interface for matching impedance according to application example two of the present invention, wherein, the peripheral impedance detection module and the impedance matching module are the same with those in the application one. The analog switch handover module includes two field effect tube VT1 and field effect tube VT2 of the P-channel CMOS type, wherein, the grid of the field effect tube VT1 connects the output end of the voltage comparator N1, the grid of the field effect tube VT2 connects the output end of the voltage comparator N2, the drains of the field effect tube VT1 and the field effect tube VT2 connect one unearthed end of the user telephone impedance Rx, the source of the field effect tube VT1 connects one end of the resistance Ry, and the source of the field effect tube VT2 connects one end of the resistance Rz.

The same path of signal voltage is input into the two voltage comparators N1 and N2, but the value of the reference voltage Vref1 and Vref2 of the non-inverting input end of the two-stage circuit are different. The reference voltage of N1 Vref=1.8V, and the reference voltage of N2 Vref2=3.3V. According to the difference of the user telephone impedance Rx, the input voltage Vi of the comparator is different too, and there are the following three situations altogether:

(1), when the impedance of the user telephone Rx=75 ohms, the input voltage of the comparator 0V<Vi<1.8V, the comparator N1 outputs the low level, and the state is "0"; while the comparator N2 outputs the high level, and the state is "1". The VT1 is in an "on" state and the VT2 is in an "off" state. The total input impedance is that R=Rx+Rz=75+75=150 ohms at this moment.

(2), when the impedance of the user telephone Rx=100 ohms, the input voltage of the comparator 1.8V<Vi<3.3V, the comparator N1 outputs the high level, and the state changes into "1"; and the comparator N2 outputs the low level, and the state is still "0". The VT1 is in an "off" state and the VT2 is in an "on" state. The total input impedance is that R=Rx+Ry=100+50=150 ohms.

(3), when the impedance of the user telephone Rx=120 ohms, the input voltage of the comparator 3.3V<Vi<5V, both the comparator N1 and N2 output the low level, and the states are "0". Both the VT1 and VT2 are in the "on" state, and the total input impedance is that R=Rx+Ry//Rz=120+50×75/(50+75)=120+30=150 ohms at this moment.

Figure 4:
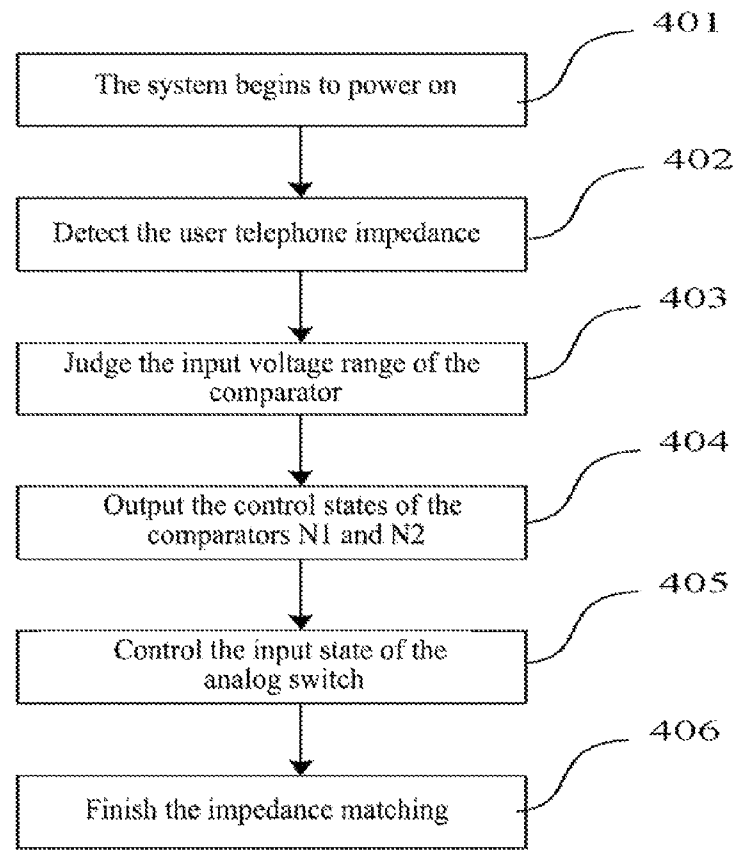
FIG. 4 is a flow chart of a wireless access box interface for matching impedance according to an application example of the present invention.

FIG. 4 is an operation flow chart of matching impedance referring to FIG. 2 and FIG. 3, including the following steps:

in step 401, the system begins to power on, and provides one path of voltage Vcc =+5V;

in step 402, the internal impedance Rx of the user telephone is detected through the AB cable;

in step 403, the input voltage Vi of the comparator is obtained after the voltage of the system power Vcc is divided through R0 and Rx, and the Vi is divided into 3 voltage ranges by the three kinds of Rx;

in step 404, the comparator N1 and N2 output different states, which are divided into three kinds of situations together, according to the different ranges of the Vi voltage value;

in step 405, the input and output of the analog switch handover module is controlled through the different states output in step 404, to perform the specific impedance matching;

in step 406, the impedance matching is finished.

It can be understood by those skilled in the art that all or part of steps in the above-mentioned method can be fulfilled by programs instructing the relevant hardware components, and the programs can be stored in a computer readable storage medium such as a read only memory, a magnetic disk or an optical disk, etc. Alternatively, all or part of the steps in the above-mentioned embodiments can be implemented with one or more integrated circuits. Accordingly, each module/unit in the above-mentioned embodiments can be implemented in the form of hardware, or in the form of software function module. The present invention is not limit to any specific form of the combination of the hardware and software.

The above description is only the preferred embodiments of the present invention and is not intended to limit the present invention. For those skilled in the art, the present invention can have various modifications and variations. All of modifications, equivalents and/or variations without departing from the spirit and essence of the present invention should be embodied in the scope of the appending claims of the present invention.

Industrial Applicability

Through the above-mentioned scheme of the present invention, it realizes the impedance matching when communicating between a wireless access box and telephones with different impedance modes. The matching process is automatic and flexible and does not need the manual configuration, and the realization technology is simple and reliable, and the cost is low. So the present invention has very strong industrial practicability.

I claim:

1. A circuit for matching impedance, comprising a processor which comprises: a peripheral impedance detection module, an analog switch handover module and an impedance matching module connected successively, wherein:

the peripheral impedance detection module is configured to detect a user telephone impedance and output information about the user telephone impedance;

the analog switch handover module is configured to provide an impedance matching path between the user telephone impedance and the impedance matching module according to the information about the user telephone impedance; and the impedance matching module is configured to provide a corresponding impedance to match the user telephone impedance through the impedance matching path provided by the analog switch handover module;

the peripheral impedance detection module further comprises an analog-to-digital conversion (ADC) detection module configured to: according to a resistance value of the user telephone impedance, output the user telephone impedance information in a high level or low level format; and the ADC detection module comprises: a first resistance (R0), a second resistance (R1), a third resistance (R2), a fourth resistance (R3), a first voltage comparator (N1) and a second voltage comparator (N2); and the impedance matching module comprises a fifth resistance (Ry) and a sixth resistance (Rz);

wherein: one end of the first resistance (R0) connects a system power (Vcc), another end connects a user telephone impedance (Rx) and negative input ends of the first voltage comparator (N1) and the second voltage comparator (N2); one end of the second resistance (R1) is earthed, another end connects a positive input end of the first voltage comparator (N1) and the third resistance (R2); one end of the third resistance (R2) connects the positive input end of the first voltage comparator (N1) and the second resistance (R1), another end connects a positive input end of the second voltage comparator (N2) and the fourth resistance (R3); one end of the fourth resistance (R3) connects the system power (Vcc), another end connects the positive input end of the second voltage comparator (N2) and the third resistance (R2); the second resistance (R1), the third resistance (R2), and the fourth resistance (R3) are divider resistances, providing reference voltage of the first voltage comparator (N1) and the second voltage comparator (N2); output ends of the first voltage comparator (N1) and the second voltage comparator (N2) connect the analog switch handover module, the first voltage comparator (N1) and the second voltage comparator (N2) output the high level or low level according to a resistance value of the user telephone impedances (Rx).

2. The circuit for matching impedance according to claim 1, wherein, when both the first voltage comparator (N1) and the second voltage comparator (N2) output the high level, the analog switch handover module sets the user telephone impedance (Rx) to connect with the sixth resistance (Rz), to obtain a total input impedance which is the resistance value of the user telephone impedance (Rx) added by a resistance value of the sixth resistance (Rz); when the first voltage comparator (N1) outputs the low level and the second voltage comparator (N2) outputs the high level, the analog switch handover module sets the user telephone impedance (Rx) to connect with the fifth resistance (Ry), to obtain the total input impedance which is the resistance value of the user telephone impedance (Rx) added by the resistance value of the fifth resistance (Ry); when both the first voltage comparator (N1) and the second voltage comparator (N2) output the low level, the analog switch handover module sets the user telephone impedance (Rx) to connect with the fifth resistance (Ry) and the sixth resistance (Rz), to obtain the total input impedance which is the resistance value of the user telephone impedance (Rx) added by a parallel resistance value of the fifth resistance (Ry) and the sixth resistance (Rz).

3. The circuit for matching impedance according to claim 2, wherein, the analog switch handover module is a analog switch (S), a first IN end (IN1) of the analog switch (S) connects an output end of the first voltage comparator (N1), a second IN end (IN2) of the analog switch (S) connects an output end of the second voltage comparator (N2), a first NO end (NO1) and a first NC end (NC1) of the analog switch (S) connect one unearthed end of the user telephone impedance (Rx), a second NO end (NO2) connects one end of the fifth resistance (Ry), a second NC end (NC2) connects one end of the sixth resistance (Rz); when both the first voltage comparator (N1) and the second voltage comparator (N2) output the high level, the first NC end (NC1) and the second NC end (NC2) of the analog switch (S) connect each other, to make the user telephone impedance (Rx) connect the sixth resistance (Rz); when the first voltage comparator (N1) outputs the low level and the second voltage comparator (N2) outputs the high level, the first NC end (NC1) and the second NO end (NO2) of the analog switch (S) connect each other, to make the user telephone impedance (Rx) connect the fifth resistance (Ry); when both the voltage comparator (N1) and the second voltage comparator (N2) output the low level, four ports, the first NC end (NC 1), the second NC end (NC2), the first NO end (NO1) and the second NO end (NO2) of the analog switch (S) connect with each other, to make the user telephone impedance (Rx) connect both the fifth resistance (Ry) and the sixth resistance (Rz).

4. The circuit for matching impedance according to claim 3, wherein, a resistance value of the fifth resistance (Ry) is 50 ohms, a resistance value of the six resistance (Rz) is 75 ohms, and the total input impedance is 150 ohms.

5. A wireless access box, comprising a circuit for matching impedance according to claim 3.

6. The circuit for matching impedance according to claim 2, wherein, the analog switch handover module comprises a first field effect tube (VT1) and a second field effect tube (VT2), wherein:

a grid of the first field effect tube (VT1) connects the output end of the first voltage comparator (N1), a grid of the second field effect tube (VT2) connects the output end of the second voltage comparator (N2), drains of the first field effect tube (VT1) and the second field effect tube (VT2) connect one unearthed end of the user telephone impedance (Rx), a source of the first field effect tube (VT1) connects one end of the fifth resistance (Ry), a source of the second field effect tube (VT2) connects one end of the sixth resistance (Rz); when both the first voltage comparator (N1) and the second voltage comparator (N2) output the high level, the first field effect tube (VT1) is in an on state, and the second field effect tube (VT2) is in an off state, to make the user telephone impedance (Rx) connect the sixth resistance (Rz); when the first voltage comparator (N1) outputs the low level and the second voltage comparator (N2) outputs the high level, the first field effect tube (VT1) is in the off state, and the second field effect tube (VT2) is in the on state, to make the user telephone impedance (Rx) connect the fifth resistance (Ry); when both the first voltage comparator (N1) and the second voltage comparator (N2) output the low level, both the first field effect tube (VT1) and the second field effect tube (VT2) are in the on state, to make the user telephone impedance (Rx) connect the fifth resistance (Ry) and the sixth resistance (Rz).

7. The circuit for matching impedance according to claim 6, wherein, a resistance value of the fifth resistance (Ry) is 50 ohms, a resistance value of the six resistance (Rz) is 75 ohms, and the total input impedance is 150 ohms.

8. A wireless access box, comprising a circuit for matching impedance according to claim 6.

9. The circuit for matching impedance according to claim 2, wherein, a resistance value of the fifth resistance (Ry) is 50 ohms, a resistance value of the six resistance (Rz) is 75 ohms, and the total input impedance is 150 ohms.

10. A wireless access box, comprising a circuit for matching impedance according to claim 9.

11. A wireless access box, comprising a circuit for matching impedance according to claim 2.

12. The circuit for matching impedance according to claim 1, wherein, the reference voltage provided by the second resistance (R1), the third resistance (R2) and the fourth resistance (R3) for the first voltage comparator (N1) is +1.8V, the reference voltage provided for the second voltage comparator (N2) is +3.3V, and the system power (Vcc) is +5V.

13. The circuit for matching impedance according to claim 12, wherein, a resistance value of the fifth resistance (Ry) is 50 ohms, a resistance value of the six resistance (Rz) is 75 ohms, and the total input impedance is 150 ohms.

14. A wireless access box, comprising a circuit for matching impedance according to claim 12.

15. A wireless access box, comprising a circuit for matching impedance according to claim 1.

* * * * *